(12) United States Patent
Orozco et al.

(10) Patent No.: US 7,019,521 B2
(45) Date of Patent: Mar. 28, 2006

(54) FAULT ISOLATION OF CIRCUIT DEFECTS USING COMPARATIVE MAGNETIC FIELD IMAGING

(75) Inventors: Antonio Orozco, Washington, DC (US); Elena Talanova, Greenbelt, MD (US); Alfred B. Cawthorne, Beltsville, MD (US); Lee Knauss, Bowie, MD (US); Thirumalai Venkatesan, Washington, DC (US)

(73) Assignee: Neocera, Inc., Beltsville, MD (US)

( * ) Notice: Subject to any disclaimer, the term of this patent is extended or adjusted under 35 U.S.C. 154(b) by 29 days.

(21) Appl. No.: 10/940,715

(22) Filed: Sep. 15, 2004

(65) Prior Publication Data

US 2005/0057246 A1 Mar. 17, 2005

Related U.S. Application Data

(60) Provisional application No. 60/502,628, filed on Sep. 15, 2003.

(51) Int. Cl.
*G01N 27/82* (2006.01)
*G01R 33/02* (2006.01)

(52) U.S. Cl. ............... 324/240; 324/248; 324/765; 324/750

(58) Field of Classification Search ........... 324/228, 324/226, 240, 244, 248, 262, 529, 750, 765; 702/117, 118
See application file for complete search history.

(56) References Cited

U.S. PATENT DOCUMENTS

| 6,433,572 B1 * | 8/2002 | Birdsley et al. ............ 324/765 |
| 6,657,431 B1 * | 12/2003 | Xiao .......................... 324/244 |
| 6,759,259 B1 * | 7/2004 | Nikawa ....................... 438/18 |
| 6,930,479 B1 * | 8/2005 | Xiao et al. .................. 324/262 |
| 2004/0207396 A1 * | 10/2004 | Xiao .......................... 324/244 |

* cited by examiner

*Primary Examiner*—Jay Patidar
(74) *Attorney, Agent, or Firm*—Rosenberg, Klein & Lee

(57) ABSTRACT

Circuit flaws in microelectronic circuitry present regions of high resistance in which a current distribution deviates from that of a defect-free circuit. The altered current distribution emits a correspondingly altered magnetic field in accordance with Ampere's Law. When compared with the magnetic field of a defect-free circuit, the anomaly in the magnetic field of the defective device is detected and the location of the circuit flaw may be determined therefrom. As the anomaly in the magnetic field is very small in magnitude, a sensitive magnetic microscope is utilized to obtain images of the magnetic fields of a defect-free reference device and a device-under-test. The distance between the magnetic sensor and the devices being scanned is precisely controlled to minimize influences of scanning distance on the difference in measured magnetic field strength. Comparative image analysis reveals the location of the circuit flaw. Maximal image registration through image interpolation, displacement and resampling optimizes the comparative image analysis.

20 Claims, 8 Drawing Sheets

DEFECTIVE

NORMAL

FAULT ISOLATION OF CIRCUIT DEFECTS USING COMPARATIVE MAGNETIC FIELD IMAGING

This Utility Patent Application is based on the Provisional Patent Application No. 60/502,628, filed 15 Sep. 2003.

BACKGROUND OF THE INVENTION

1. Field of the Invention

The invention described herein is related to fault isolation in microelectronic circuitry. More specifically, the present invention is directed to locating circuit defects in integrated circuits by comparing images of the magnetic field thereof with those of standard reference integrated circuit known to be free from the defect.

2. Description of the Prior Art

As integrated circuitry becomes increasingly compact and the packaging associated therewith becomes more complex, the localization of circuit defects becomes correspondingly difficult. The localization of flaws is particularly difficult for those classified to the high resistance (HR) defect class of packaging and interconnect anomalies causing an increase in the impedance of a signal line to beyond the designed specification thereof. These HR defects include cracked signal traces, cracked plated through-holes, delaminated vias and improperly wetted controlled collapse chip connection (C4) bumps. Such HR defects can result in devices that do not operate at optimum speed, have an increased probability of failing in the field, or simply do not work at all.

The physical size of microelectronic circuitry presents unique failure analysis challenges. In some cases, microscopic dissection of a failed circuit may yield the location of the undesired anomaly. However, the failed circuit is destroyed by the process, thus precluding any subsequent functional testing should the inspiration to do so suddenly befall the tester.

The prevailing non-destructive method for localizing HR defects in integrated circuits is time domain reflectometry (TDR). The TDR technique involves applying a current pulse of short duration to an input port of a signal line of an integrated circuit and monitoring the input port for one or more reflections of the applied pulse. The time measured between the application of the pulse and the detection of the reflected signal is an indication of the distance from the input port to the location of the impedance change. However, such reflected signals may be due to normal transitions within the device and not necessarily due to an undesired anomaly. Thus, tedious analysis by comparison to reflection characteristics of a standard device must be conducted once the data are collected. Additionally, even when the analysis is performed flawlessly, the spatial resolution of TDR in microelectronic circuitry is typically 200 microns, which is greater than the size of most components of modern integrated circuits.

It is thus apparent from the shortcomings of the prior art that the need exists for a non-destructive fault isolation technique for use in microelectronic circuitry implementing less tedious analysis while simultaneously providing higher spatial resolution.

SUMMARY OF THE INVENTION

The present invention provides a method for locating defects in an electronic circuit by means of a scanning magnetic microscope for obtaining images of magnet fields in a predetermined area thereof. A reference circuit and a circuit-under-test are provided to the scanning magnetic microscope and a corresponding fiducial is respectively located on each circuit. A test current is induced in the reference circuit and a micrographic image of the magnetic field emitted therefrom is obtained. An equivalent test current is induced in the circuit-under-test and a second micrographic image is obtained from the magnetic field emitted therefrom. A spatial transform is applied to the second micrographic image for providing magnetic field pixel values for the circuit-under-test at locations other than the original image pixel locations, i.e., the second micrographic image is spatially displaced and resampled from a continuous-space representation of the magnetic field to produce the transformed micrographic image. A difference image between the transformed micrographic image and the reference micrographic image is formed and a registration error is computed from the difference image. The second micrographic image is iteratively transformed using an updated spatial displacement until the registration error of the difference image resulting therefrom is minimized.

DETAILED DESCRIPTION OF THE PREFERRED EMBODIMENTS

The method of the present invention constitutes a novel approach to isolating circuit defects, such as high resistance (HR) defects, using current imaging and comparative image analysis. Current imaging is based on the measurement and spatial mapping of the magnetic field generated by current carried in the structures of a device-under-test (DUT). Comparative image analysis identifies local differences between images. By way of the precise current imaging and subsequent comparative image analysis, the present invention attains localization of circuit defects to within tens of microns.

As is well known, the characteristic impedance of a signal line changes at geometric transitions in the line. An HR defect may manifest itself as such a geometrical change such as through regions of delamination, cracks, voids, etc. HR defects may also result from improper processing of materials during integrated circuit construction. Such processing failures may affect the conductivity in the region of the affected material, thus leading to a corresponding change in resistance in the region.

Figure 1B:
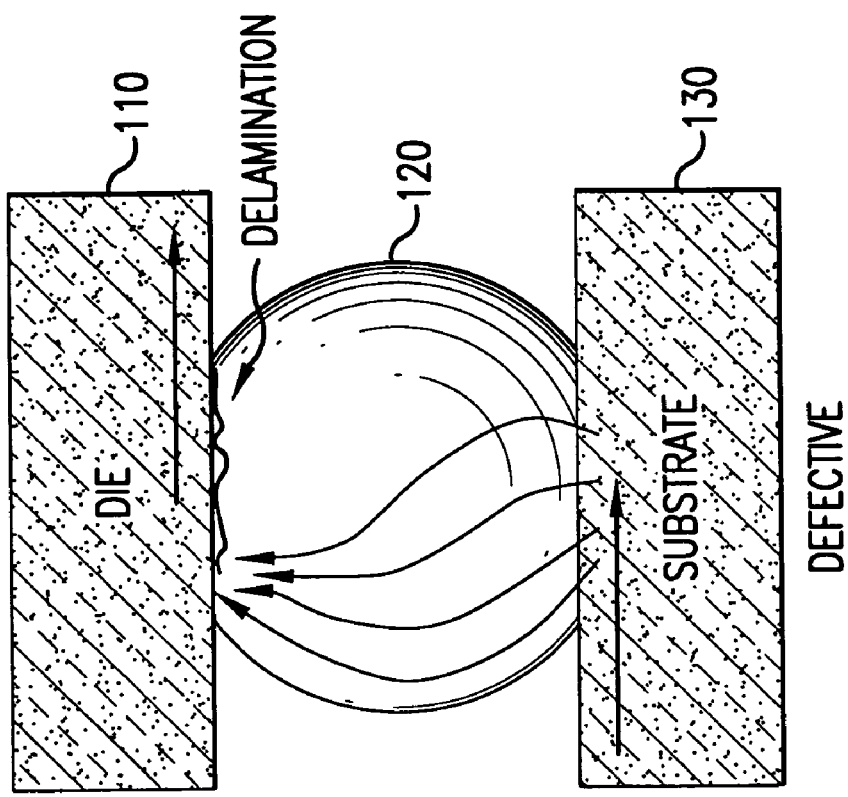
FIGS. 1A–1B illustrate the effect on current distribution from a high resistance delamination defect.
Figure 1A:
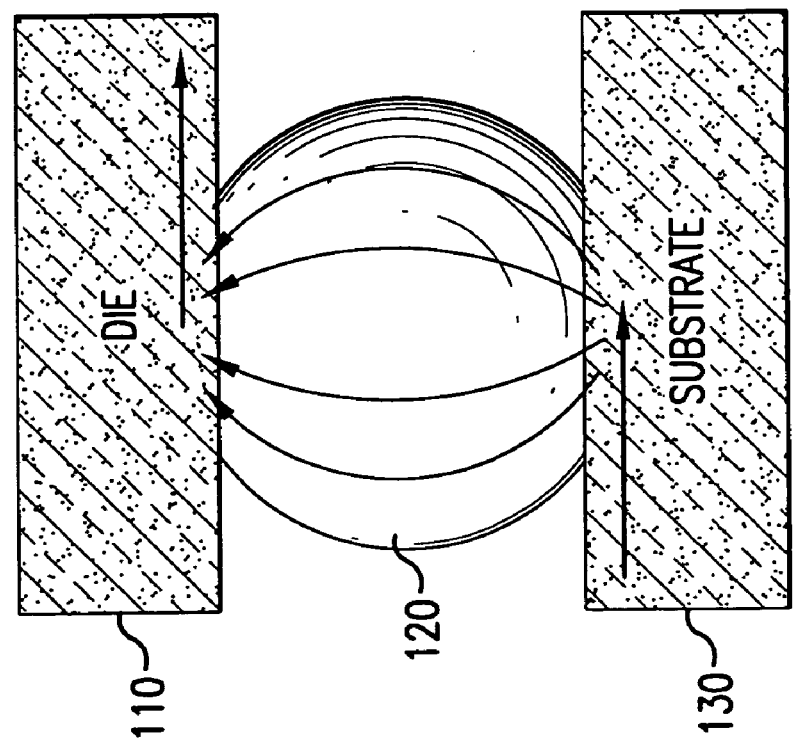

The current distribution in a given region of a microelectronic circuit is a function of the geometry of, and material formed in, the region. Clearly, the current distribution is affected by geometric anomalies associated with an HR defect. An example of such an affected current distribution is illustrated in FIGS. 1A and 1B. The Figures depict a typical C4 bump interface of an integrated circuit package commonly referred to in the industry as a "flip-chip" package. FIG. 1A illustrates the normal configuration in which a circuit die 110 is electrically coupled to the package substrate 130 through the C4 bump 120. As is shown in FIG. 1A, the lines of current, shown as the directed arrows, are evenly distributed through the interface at C4 bump 120. In FIG. 1B, however, the delamination of the metallic layer on the die 110 minimizes the available area for electric contact thereon. As such, the current distribution is skewed, as is shown in the diagram.

As the current distribution is affected by the geometric alteration, a corresponding change in the magnetic field distribution can be expected. That is to say, a small change in the magnetic field distribution in the area around the defect would be observed when compared to the magnetic field distribution of a normal, defect-free device. A detailed image comparison between the good and failing parts would be capable of detecting this difference and subsequently locating the defective region.

It should be apparent that other circuit defects may affect the current distribution while not presenting an increase in the resistance of a circuit element. For example, plane-to-plane shorting of the power distribution network of an integrated circuit does not exhibit characteristics of a high resistance defect, but may instead distribute undesirable current flows over relatively large areas. These undesirable flows are detectable by the method of the present invention, as will be made clear in the paragraphs that follow.

As previously stated, the spatial magnetic field distribution $\vec{B}(\vec{r})$ is related to the spatial current density distribution $\vec{J}(\vec{r})$ by Ampere's law:

$$\vec{B}(\vec{r}) = \frac{\mu_0}{4\pi} \int \int \int \frac{\vec{J}(\vec{r}-\vec{r}') \times (\vec{r}-\vec{r}')}{\|\vec{r}-\vec{r}'\|^3} d^3 r'. \tag{1}$$

This is a fundamental relationship between the magnetic field created at a point $\vec{r}$ by a given current density $\vec{J}(\vec{r}')$ located thereat. Any change in the current distribution should result in a change in the magnetic field distribution of the failing device, $\vec{B}_f(r)$.

In view of the superposition principle, at least locally in the neighborhood of the defect, $N_d$, we can consider the current distribution in a failing part, $\vec{J}_f(\vec{r})$, to differ from that of a defect-free device, $\vec{J}(\vec{r})$, by some amount $\Delta \vec{J}(\vec{r})$, or:

$$\vec{J}_f(\vec{r}) = \begin{cases} \vec{J}(\vec{r}) - \Delta \vec{J}(\vec{r}) & \vec{r} \in N_d \\ \vec{J}(\vec{r}) & \text{otherwise.} \end{cases} \tag{2}$$

The expression for the magnetic field of the failing device is $$\vec{B}_f(\vec{r}) = \frac{\mu_o}{4\pi} \int \int \int \frac{\vec{J}_f(\vec{r}-\vec{r}') \times (\vec{r}-\vec{r}')}{\|\vec{r}-\vec{r}'\|^3} d^3 r'. \tag{3}$$

From eq. (2) the magnetic field can be expressed s:

$$\vec{B}(\vec{r}) = \frac{\mu_o}{4\pi} \int \int \int \frac{(\vec{J}(\vec{r}-\vec{r}') - \Delta \vec{J}(\vec{r}-\vec{r}')) \times (\vec{r}-\vec{r}')}{\|\vec{r}-\vec{r}'\|^3} d^{3}r' \tag{4}$$

$$= \frac{\mu_o}{4\pi}$$

$$\begin{cases} \int \int \int \frac{\vec{J}(\vec{r}-\vec{r}') \times (\vec{r}-\vec{r}')}{\|\vec{r}-\vec{r}'\|^3} d^3 r' - \int \int \int \frac{\Delta J(r-r') \times (r-r')}{\|r-r'\|^3} d^3 r' & r \in N_d \\ \int \int \int \frac{\vec{J}(\vec{r}-\vec{r}') \times (\vec{r}-\vec{r}')}{\|\vec{r}-\vec{r}'\|^3} d^3 r' & \text{otherwise} \end{cases}$$

It should be noted that the first term of the right hand side of the above equation is simply the magnetic field of the defect free device $\vec{B}(\vec{r})$. Thus, $$\vec{B}_f(\vec{r}) = \begin{cases} \vec{B}(\vec{r}) - \Delta \vec{B}_d(\vec{r}) & \vec{r} \in N_d \\ 0 & \text{otherwise} \end{cases} \tag{5}$$

where, $$\Delta \vec{B}_d(\vec{r}) = \frac{\mu_0}{4\pi} \int \int \int \frac{\Delta \vec{J}(\vec{r}-\vec{r}') \times (\vec{r}-\vec{r}')}{\|\vec{r}-\vec{r}'\|^3} d^3 r \tag{6}$$

is the magnetic signature of the defect. The current density change, $\Delta \vec{J}(\vec{r})$, must vanish abruptly outside the defect region as it is constrained to the physical boundaries of the defect itself. The associated magnetic field thereof, however, may extend well beyond the geometric boundaries of the defect.

In the presence of noise, the expression of (5) should be modified as follows:

$$\vec{B}_f(\vec{r}) = \begin{cases} \vec{B}(\vec{r}) - \Delta \vec{B}_d(\vec{r}) + \vec{\sigma}_B(\vec{r}) & r \in N_d \\ \vec{\sigma}_B(\vec{r}) & \text{otherwise} \end{cases} \quad (7)$$

where $\sigma_B$ is the magnetic noise, which is assumed to have a white noise distribution.

It is thus evident that careful measurement of the magnetic field distribution of both defect-free and defective devices would allow the extraction of the residual magnetic field due to the defect. This may be achieved by subtracting the measured magnetic field distributions i.e., $$\vec{B}(\vec{r}) - \vec{B}_f(\vec{r}) = \begin{cases} \vec{B}_d(\vec{r}) + \vec{\sigma}_B(\vec{r}) & r \in N_d \\ \vec{\sigma}_B(\vec{r}) & \text{otherwise.} \end{cases} \quad (8)$$

From (8) it is clear that magnetic noise limits the detectability of the residual field. If the magnetic noise $\sigma_B$ is sufficiently large, it will mask the residual magnetic field coming from the defect, $\Delta B_d$. This problem is overcome through the use of highly sensitive magnetic sensors.

Figure 2:
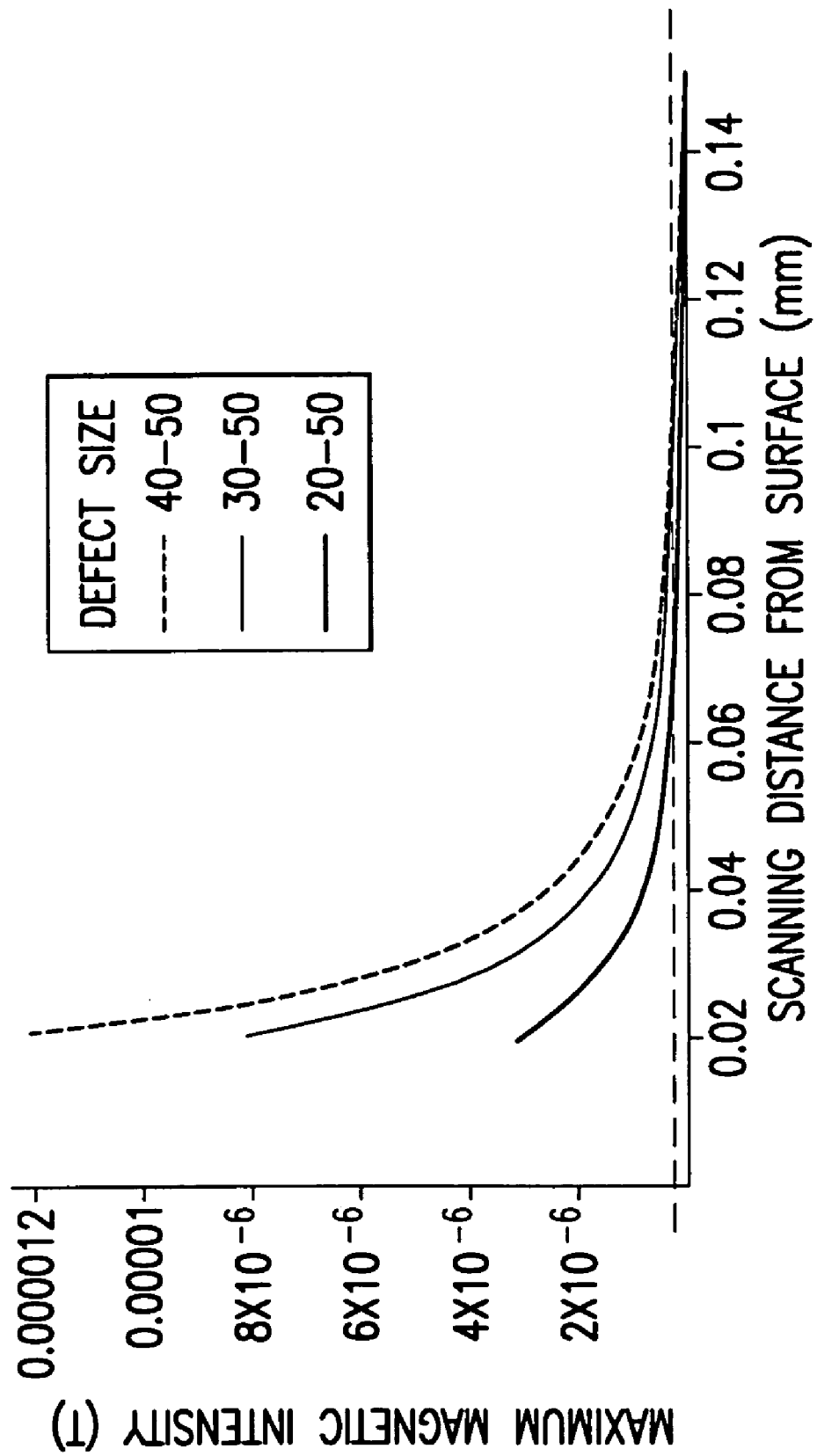
FIG. 2 is a graph demonstrating the required sensitivity of a magnetic probe to detect high resistance defects.

Referring now to FIG. 2, there is shown a graph in which the maximum intensity of a magnetic anomaly in Tesla (T) as a function of the z-distance of a magnetic sensor from the defect for three different defect sizes. The graph was created through a simple one dimensional model of an infinitely long wire of finite width. A "mouse bite" in the wire was simulated by changing the width in a predetermined segment thereof. As is shown by the legend, several defects, each of different size, are shown in the graph (the first numeral in the legend indicates the amount of the wire remaining from the total width, which is indicated by the second numeral). The horizontal dashed line represents a noise level of about 20 nT. The graph of FIG. 2 illustrates that the residual field vanishes gradually as the detector is moved from the defective region. As discussed hereinabove, the intensity of the residual field must be larger than the noise level for a detection technique to be capable of discriminating the defect. A highly sensitive magnetic sensor, such as a thin-film super conducting quantum interference device (SQUID) is implemented by the present invention to detect the residual field emitted in the defective region.

Figure 3:
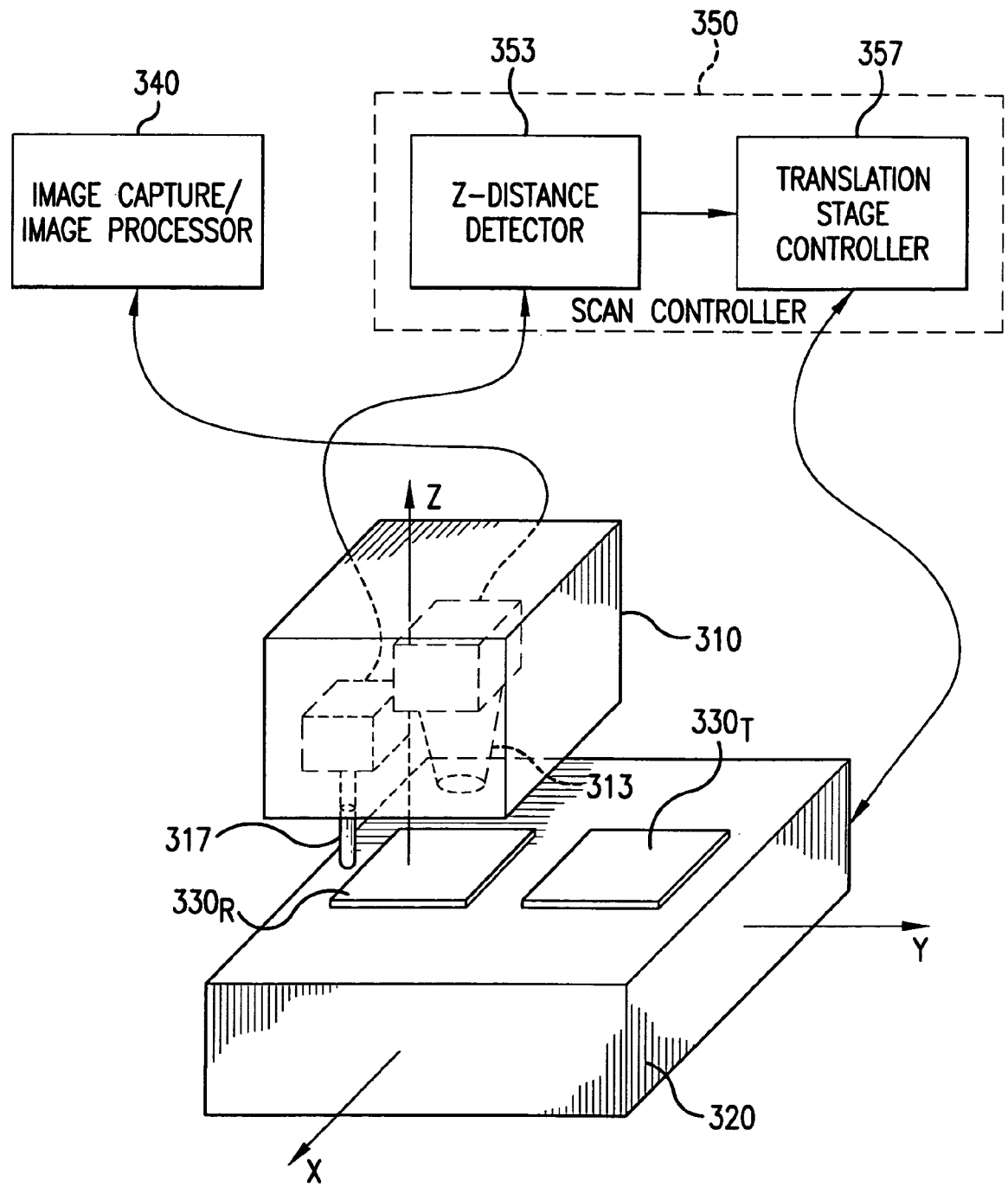
FIG. 3 is a block diagram of an exemplary system for executing the method of the present invention.

A simplified block diagram of a magnetic microscope for performing certain aspects of the present invention is illustrated in FIG. 3. For purposes of the present discussion, an exemplary embodiment is assumed by which the magnetic microscope is a scanning SQUID microscope such as is well known in the magnetic microscopy field. Such a SQUID microscope may include a microscope probe head 310 selectively positioned over a translation stage 320. Translation stage 320 may be a two dimensional translational stage in which motion is confined to the x-y plane. In such case, microscope probe head 310 must be mounted on a movable platform such that the z-distance between translation stage 320 and magnetic probe head 310 may be selectively controlled. Alternatively, translation stage 320 may be a three dimensional translation stage movable along the x, y and z axes.

As is shown in FIG. 3, a defect-free reference device $330_R$ and the device-under-test $330_T$ are affixed to the translation stage 320. In certain embodiments of the present invention, the devices are scanned sequentially so as to obtain corresponding images of the respective magnetic fields. Thus, the position of SQUID sensor 313 relative to the current carrying elements must be precisely maintained. The scan condition for each device should be as near to identical as realizable so as to improve the effectiveness of the magnetic anomaly localization method.

To implement precision control of the scanning operation certain embodiments magnetic microscope probe head 310 have installed thereon a z-distance probe, such as touch probe 317, which is electrically coupled to z-distance detector 353 in scan controller 350. Touch probe 317 provides a reference in the z-distance of SQUID detector 313 by providing an electric signal to z-distance detector 353 upon coming in contact with a surface in the x-y plane. In essence, touch probe 317 "touches" a point on, for example, reference device $330_R$ and, after subsequent translation, touches the same point on DUT $330_T$. Any discrepancy in the z-distance between the two points on the respective devices is compensated for via the scan controller 350, as will be described below. By ensuring that touch probe 317 is able to discriminate sub-micron distances, control of the z-distance from the current carrying element to the SQUID detector 313 is precisely maintained.

Translation stage 320 is coupled to translation mechanisms (not shown) known in the field of scanning microscopy, (e.g., stepper motors, piezoelectric actuators, etc.), electrically coupled to translation stage controller 357. Translation stage controller 357 provides precision control to the translation stage 320 and is coupled to z-distance detector 353. By way of the present invention, z-distance detector 353 provides z axis positioning data to translation controller 357, which, in turn, uses that information to maintain a consistent z-distance from the working surface throughout the scanning process.

As is shown in the FIG. 3, SQUID sensor detector 313 is electrically coupled to image capture/image processor 340 for obtaining and processing images of the magnetic fields detected by SQUID sensor 313. Separate images are obtained for each of reference device $330_R$ and device-under-test $330_T$. Image processing methods of the present invention compensate for image misregistration during comparative image analysis, as described below.

Figure 4:
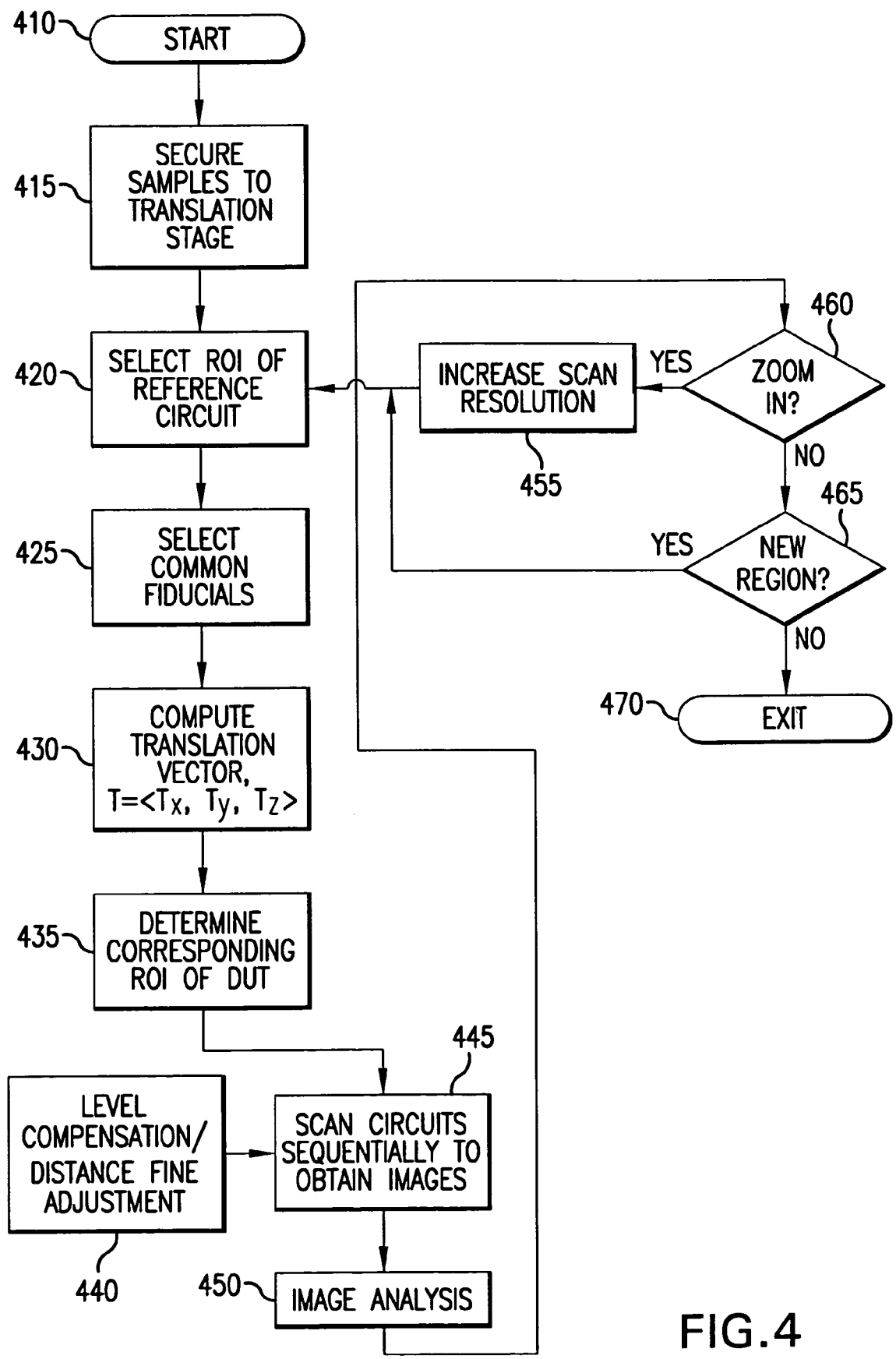
FIG. 4 is a flow chart illustrating an exemplary scan procedure of the present invention.

Certain principal method steps for an exemplary scanning procedure are given by way of the flow chart of FIG. 4. The process is initiated at start block 410 and flow is transferred to block 415 whereby reference device $330_R$ and DUT $330_T$ are secured to the translation stage 320. The user then selects a region of interest of the reference circuit, as shown at block 420, through a user interface (not shown). A common fiducial is respectively selected on each device, as indicated at block 425. The fiducial on each device $330_R$, $330_T$, provides a reference point common to both devices from which subsequent measurements may be referred.

The fiducials may be structures specifically designed for the purpose of providing a reference point or may be any predetermined feature of the device. Once common fiducials have been selected, flow is transferred to block 430 in which a translation vector, $T=(T_x, T_y, T_z)$, is computed for each point in the region of interest of the reference circuit to a corresponding point on the device under test $330_T$. It is significant to note that the translation vector $T_z$ not only provides information as to the location in the x-y plane of the point on the device under test $330_T$, but also provides the z-distance coordinate of the point. As previously stated, touch probe 317 is used to determine differences in height between points on reference device $330_R$ and the corresponding point on DUT $330_T$ and the z-distance is maintained via movement of translation stage 320 as controlled by controller 357.

In certain embodiments of the present invention, the fiducials are selected and the translation vectors for an entire device, or a set of ROIs for a device, are computed a priori, i.e., after securing the devices to the translation stage and prior to image acquisition. This allows for greater throughput when more than one DUT is to be tested at once. In such instances, the method steps of blocks 435 and 430 may be performed prior to the iteration loop.

Once the movement between devices has been coordinated, flow is transferred to block 435, whereby a region of interest of the device-under-test is located that corresponds to the region of interest of the reference circuit. The process continues at block 445 in which the devices are scanned sequentially to obtain the magnetic field images. This is achieved by taking a magnetic field measurement with SQUID sensor 313 at a point on reference device $330_R$ and moving the translation stage 320 so as to place the same point on device under test $330_T$ under SQUID detector 313. This process is then repeated until measurements for all points in the region of interest have been collected from both devices $330_R$, $330_T$.

During the process of sequential scanning, level compensation/distance fine adjustment is performed to ensure that SQUID detector 313 is maintained at a consistent z-distance from the working surface of each part as indicated at block 440. In certain embodiments of the present invention, the level of the surface of both devices is sampled via touch probe 317. The level data are maintained in scan controller 350 and are used in positioning translation stage 320 during scanning operations so as to maintain a consistent relative distance from the current carrying element to SQUID sensor 313.

Once the images from both devices have been obtained, the comparative image analysis is performed, as shown at block 450. The image analysis will be discussed in detail in paragraphs that follow. However, once the image analysis has been completed, the user may be presented with an option of zooming in on a particular sub-region, as shown by the decision block 460. If the user decides to zoom in on a sub-region, the scan resolution is increased as shown at block 455 and a new region of interest within the original region of interest is selected at block 420. The scan is performed in accordance with the new scan resolution via the method steps previously described. If the user has decided not to zoom in on a sub-region, it is determined if a new region of interest is to be examined as indicated at decision block 465. If a new region is selected, the associated region of interest is selected at block 420 and the process is repeated to obtain new images of the selected region of interest. If the user decides not to proceed with a new region, the process is exited as shown at block 470.

It should be clear to the skilled artisan that even with exercising great care in securing reference device $330_R$ and DUT $330_T$ to the translation stage, exact duplication of the orientation in space of one object by another object is virtually impossible. Even small differences in the orientation in space of the two devices $330_R$, $330_T$ will appear as a corresponding difference in the data obtained during the scan. Thus, the scan for the reference device $330_R$ will be performed in one relative orientation of the SQUID detector 313 to the device and the scan of the DUT $330_T$ will occur in a different relative orientation between the SQUID detector 313 and the device $330_T$. Whereas, differences in the working distance between the SQUID sensor 313 and a device are compensated for during the scanning operation, as described above, relative spatial skew of the parts in the x-y plane add a noise component to the detection of HR defects.

Figure 5:
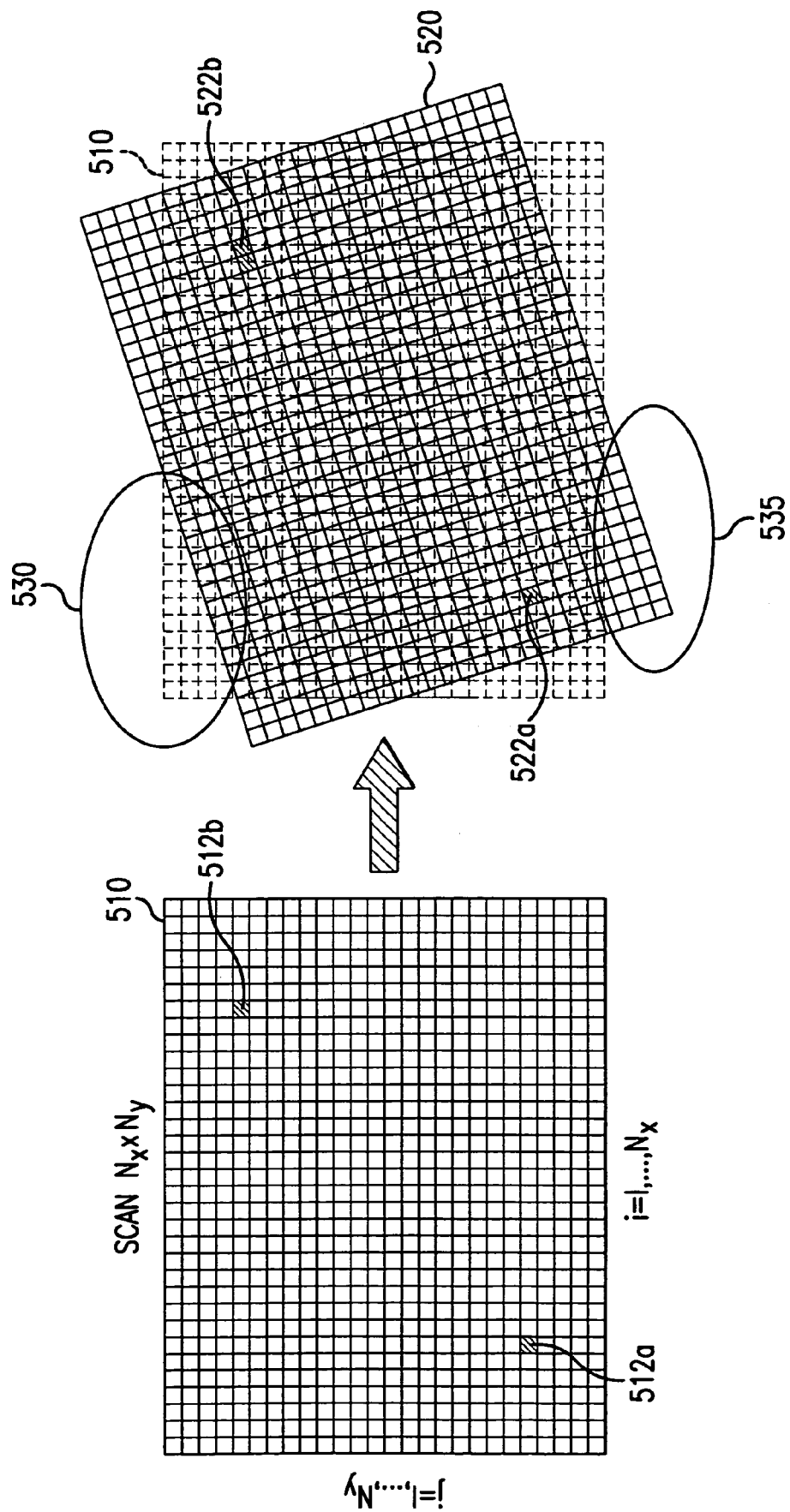
FIG. 5 is an illustration of image registration shortcomings of the prior art.

Simple relative rotation between obtained magnetic field images fails to result in sufficient alignment of the image data to detect the subtle differences in magnetic fields associated with high resistance defects. This shortcoming is depicted in FIG. 5, wherein the image of the magnetic field of the reference device $330_R$ is indicated at 510 and is composed of $N_x \times N_y$ pixels. The reference image 510 includes locations 512a, 512b which are pixel positions of the known locations of the chosen fiducials.

The image of the DUT $330_T$ is shown at 520 and also consists of $N_x \times N_y$ pixels. The DUT image 520 includes locations 522a, 522b which are pixel positions of the locations of the selected fiducials on the DUT $330_T$. As is shown in the Figure, an image processing technique of the prior art attempts to register the image by rotating and translating DUT image 520 so as to align fiducial locations 522a, 522b respectively with locations 512a, 512b of reference image 510.

As is shown in FIG. 5, simple relative rotation of images 510, 520 produces significant error to comparative image analysis. Most notably, errors are introduced in the regions where the images do not overlap, such as at region 530 and at region 535. Thus, any attempt to subtract the data of reference image 510 from DUT image 520 would produce significant error, especially in those regions 530, 535.

The choice of image resolution may also introduce errors when applying comparative image analysis. For example, if the resolution is chosen too coarse, alignment of the fiducials may prove extremely difficult. This is shown in FIG. 5 at location 522b where the fiducial location of the DUT image 520 occupies two pixels whereas the corresponding fiducial location on reference image 510, i.e., 512b, occupies a single pixel. It should be clear that the actual number of pixels will vary by application, however, the example provided by FIG. 5 illustrates the nature of the alignment problems in dealing with discrete image data.

The method of the present invention overcomes the data alignment shortcomings of the prior art by first transforming the image of the magnetic field of the DUT image 520 into a continuous space representation thereof. The data frame of the DUT image 520, i.e., the region of interest, may then be rotated and translated freely without regard to alignment of specific pixels. Once the data frame has been rotated and/or translated, the continuous representation of the magnetic field of the DUT device is discretized, or pixilated to the same resolution as the reference image 510. A difference image, i.e., the difference in pixel values of the reference image and the rotated DUT image, is formed and a registration error measure is computed. The process of rotating/translating the data frame, pixilating the continuous-space representation of the magnetic field to the rotated data frame, forming the difference image and computing the registration error measure is repeated until the error measure is minimized. The resulting difference image may then be used to locate any magnetic anomalies.

In preparation for the comparative image analysis, the image 520 of the magnetic field for the DUT $330_T$ is interpolated to produce, $$B^{FIT}[x,y]=f_I[B_T(i,j)], \quad (9)$$

where $B^{FIT}$ is a continuous-space representation of the magnetic field in two-dimensional Cartesian coordinates, (x, y), $f_I$ is an interpolating function and $B_T$ is the pixel value of the DUT image 520 at pixel coordinates (i, j). The interpolation function $f_I$ may be any interpolation function suitable for interpolating between discrete image values. In certain embodiments of the present invention, the interpolation function is a cubic or spline surface fitting to produce an interpolating polynomial. The interpolating polynomial is then represented in this discussion as $B^{FIT}[x, y]$.

With an interpolating function defined, i.e., the data for the magnetic field of the DUT $330_T$ being represented in continuous-space form, the image data may be transformed to a new coordinate system which more closely coincides with the coordinate system of the reference image as a originally scanned. Such a transform may take the form of, $$r^*_\mu = T_\mu[\xi_x, \xi_y] + R[\theta] \cdot r_v, \tag{10}$$

where exemplary terms are given by $$T[\xi_x, \xi_y]:(x,y)^* = (x,y) + (\xi_x, \xi_y)$$

$$R[\theta]:(x,y)^* = (x,y) \cdot R(\theta).$$

Figure 6:
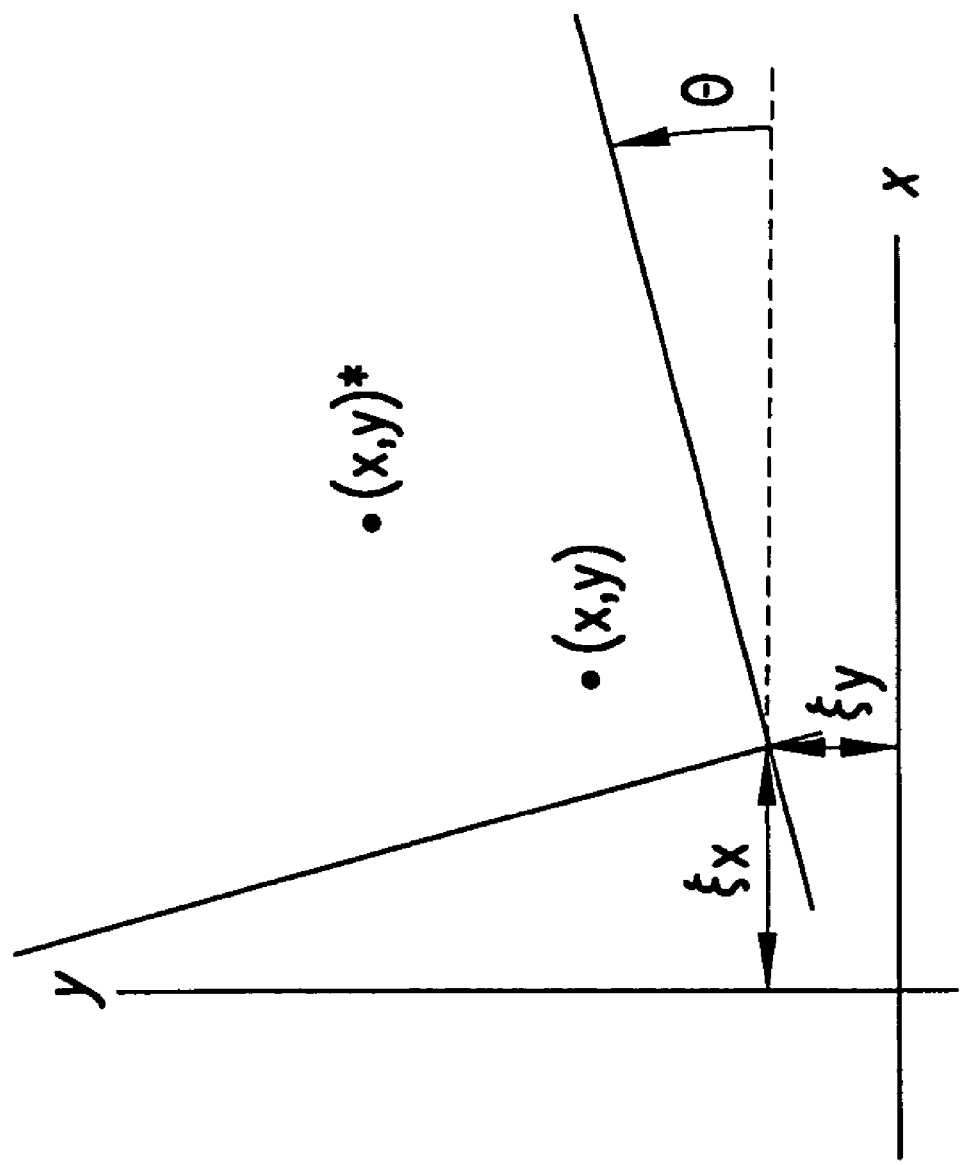
FIG. 6 is an illustration of an exemplary coordinate system as implemented by the present invention.

The transformation of coordinates in accordance with the relationship above is shown in FIG. 6 where $r^*_\mu = (x, y)^*$ is the coordinate of the data originally located at coordinate (x, y).

Once the magnetic image data has been translated and rotated into its new coordinate system, the data may then be re-pixilated, or re-sampled, according to, $$B_{i,j} = B^{FIT}[x^*_i, y^*_j], \tag{11}$$

where $B_{i,j}$ is the rotated image data and $x^*_i$ and $y^*_j$ are the x and y coordinates of the pixel located at (i, j) in the transformed coordinate system.

A difference image is formed via the relationship, $$D_{i,j} = R_{i,j} - B_{i,j}, \tag{12}$$

where $D_{i,j}$ is the difference image data at pixel location (i, j), $R_{i,j}$ is the pixel data of the reference image 510 at pixel (i, j) and $B_{i,j}$ is the transformed image data at pixel location (i, j). However, the difference image D may not be the result of the optimal alignment of reference image 510 and DUT image 520. To ensure that the image difference is the result of optimum subtraction, a performance estimator, $\sigma_k$ may be used to provide an indication as to the data alignment in the two images i.e., maximum image registration Examples for estimators $\sigma_k$ are:

$$M = \max[|D|] \tag{13}$$

$$d = StdDev[D] \tag{14}$$

$$s = -\sum_{i,j} D_{i,j} \log[D_{i,j}], \tag{15}$$

where M is the maximum of the norm of D, d is the standard deviation of D and s is the image entropy of image D. It should be clear to the ordinarily skilled artisan that other estimators may be used, such that the minimum value of which will assure that the transformed image is properly registered to the reference image. The minimum value for any of the exemplary estimators $\sigma_k$ above results in maximum image registration and may be found by iteration over many different transformations, as will be shown below.

Figure 7:
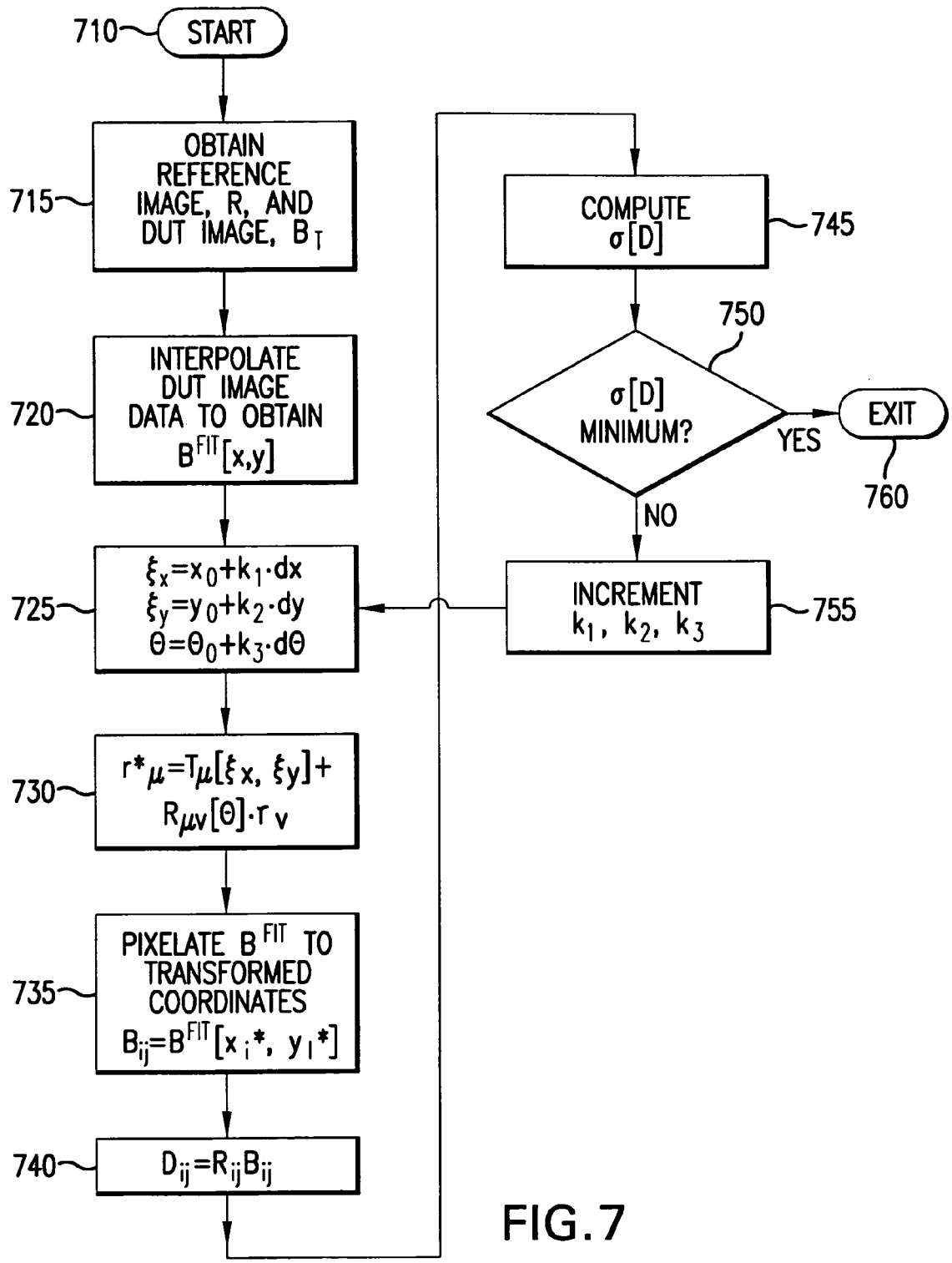
FIG. 7 is a flow chart illustrating steps of an exemplary comparative image analysis procedure of the present invention.

Referring now to FIG. 7, there is shown a flow chart of the certain key method steps in aligning the data for comparative image analysis, as implemented by certain embodiments of the present invention. The process is entered at start block 710, from which flow is transferred to block 715, whereby the image for R of the reference device and the image $B_T$ for the DUT are obtained. The fitting polynomial $B^{FIT}(x, y)$ is determined at block 720.

Once the interpolation polynomial has been found, iterations are executed to find the optimal data alignment. At block 725, initial values for the coordinates of the transform system are initiated and flow is transferred to block 730 where a new set of transformed coordinates are returned. At block 735, the DUT image data are re-sampled via the interpolating polynomial as described above. Flow is transferred to block 740, whereby the difference image is formed and a new error estimation is computed at block 745. It is then determined if the registration error estimation $\sigma[D]$ is a minimum as indicated at block 750. If the registration error estimation is not minimum, new values for the transform coordinates are established by adding a small amount thereto (through multipliers $k_1$, $k_2$, $k_3$ at block 725) and the process is repeated. If it is found at block 750 that $\sigma[D]$ is at a minimum value, the process is exited at block 760. At this point, the difference image D is the result of optimum subtraction and can be used for the determination of magnetic anomalies.

Figure 8:
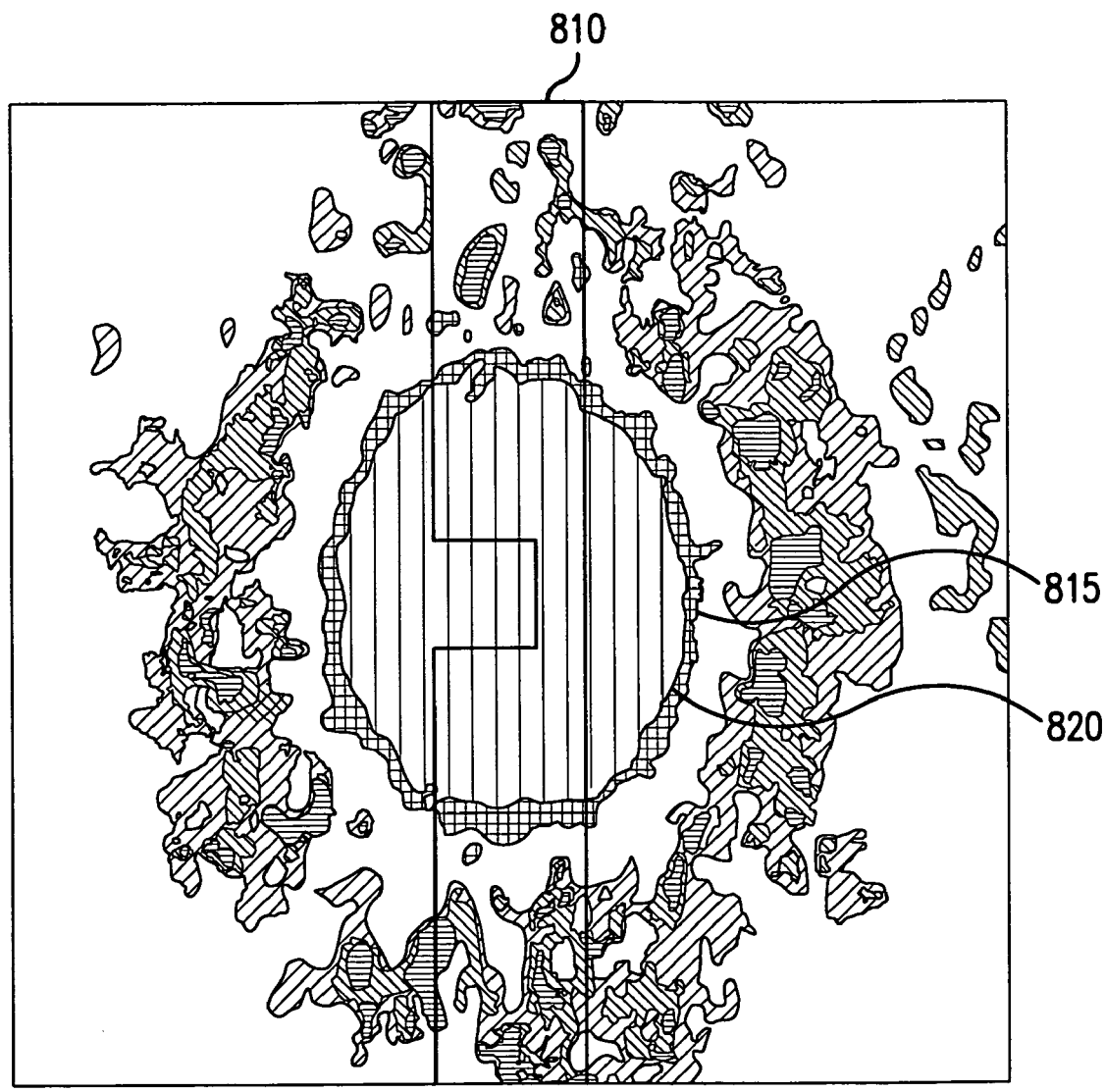
FIG. 8 is an illustration of a magnetic anomaly corresponding to a high resistance defect as located by the present invention.

An exemplary image of a magnetic anomaly as determined by the method of the present invention is shown in FIG. 8. As shown in the Figure, a signal trace 810 has removed therefrom a "mouse bite" indicated at 815. As is well known in the art, such a geometric transition presents a significant change in impedance at the location thereof. This defect appears as a Gaussian-shaped peak 820 in the image data of the difference image. The center of the peak indicates the location of the HR defect. It has been found that the method of the present invention may locate such HR defects to within tens of microns.

Whereas, the illustration of FIG. 8 depicts a defect having a Gaussian profile in the magnetic signature thereof, other magnetic signatures, such as the magnetic dipole signature, exist and are detectable by the present invention. It should be clear to the skilled artisan that the magnetic field residual due to a particular defect is a function of the geometry thereof and its relationship to the surrounding circuit elements. The location of the defect can be found by knowledge of the magnetic field distribution as a function of the geometry of the emitter. For example, in the case of a magnetic dipole signature, the centroid of the signature region, i.e., the midpoint between dipole extrema, provides the location of the defect. For defects producing peak-shaped signatures, such as the Gaussian peak of FIG. 8, the centroid produces the location of the defect. In the case of symmetrical magnetic signature peaks, the centroid coincides with the peak maximum.

The description of the invention as presented above is illustrative and not restrictive. Many variations, alternatives and modifications will become apparent to those of skill in the art upon reviewing this Disclosure. The scope of the invention described herein should, therefore, be determined not with reference to the description presented above, but instead should be determined with reference to the appended Claims along with their full scope of equivalence.

What is claimed is:

1. A method for locating defects in an electric circuit, the method comprising the steps of:

providing a scanning magnetic microscope for obtaining micrographic images of magnetic fields, said scanning magnetic microscope including a magnetic probe selectively displaceable relative to a specimen securing stage;

obtaining from a first region of a reference circuit secured to said specimen securing stage a reference micrographic image of a first magnetic field emitted therefrom responsive to a first test current, said first region spatially located on said reference circuit relative to a first fiducial thereon, said first micrographic image including a predetermined number of pixels;

obtaining from a second region of a circuit-under-test secured to said specimen securing stage a test micrographic image of a second magnetic field emitted therefrom responsive to a second test current, said circuit-under-test circuit being substantially identical in construction to said reference circuit, said second region spatially located on said circuit-under-test relative to a second fiducial thereon, said second fiducial located at a relative location of said circuit-under-test equivalent to the relative location of the first fiducial to said reference circuit, said second test current being substantially equivalent in direction and magnitude to said first test current, said second micrographic image including said predetermined number of pixels;

selecting a spatial displacement value to apply to said test micrographic image; and, applying a spatial transform to said test micrographic image for producing a transformed micrographic image of a spatially displaced magnetic field thereof, said spatial transform computing pixel values for said transformed micrographic image via an interpolation function determined from said predetermined number of pixels of said test micrographic image, said interpolation function computing an estimated magnetic field value for a spatial coordinate of said second magnetic field offset by said spatial displacement value;

computing a registration error measure from a difference between said transformed micrographic image and said reference micrographic image; and repeating the method at said spatial displacement value selecting step until said registration error measure is minimized.

2. The method for locating defects in an electric circuit as recited in claim 1 further including the steps of:

providing a distance determining probe to said scanning magnetic microscope for respectively determining a corresponding distance from said reference circuit to said magnetic probe and from said circuit-under-test to said magnetic probe; and adjusting said distance from said reference circuit to said magnetic probe during said reference micrographic image obtaining step to be equivalent to said distance from said circuit-under-test to said magnetic probe during said test micrographic image obtaining step.

3. The method for locating defects in an electric circuit as recited in claim 2 further including the steps of:

providing said specimen securing stage with a three-axis translation stage for selectively displacing said specimen securing stage along three orthogonal axes relative to said magnetic probe;

providing said three-axis translation stage with a translation stage controller for controlling the displacement thereof;

providing said distance determining probe with a touch probe, said touch probe providing an electric signal to said translation stage controller when contact by said touch probe with a surface is established.

4. The method for locating defects in an electric circuit as recited in claim 3, whereby said distance adjusting step includes the steps of:

determining at a plurality of locations on said reference circuit a distance at which said electric signal is provided by said touch probe;

determining at a plurality of locations on said circuit-under-test a distance at which said electric signal is provided by said touch probe; and controlling said three-axis translation stage with said translation stage controller such that said distance at which said electric signal is provided by said touch probe is maintained during said reference micrographic image obtaining step and during said test micrographic image obtaining step.

5. The method for locating defects in an electric circuit as recited in claim 1, whereby said spatial transform applying step includes the steps of:

determining a set of polynomial coefficients by applying a spline fit algorithm to said predetermined number of pixels of said test micrographic image;

forming a polynomial in spatial coordinates of said second magnetic field from said polynomial coefficients, said polynomial providing said interpolation function; and, computing said estimated magnetic field value for each of said predetermined number of pixels of said test micrographic image by supplying spatial coordinates of each of said predetermined number of pixels of said test micrographic image offset by said spatial displacement value to said interpolation function.

6. The method for locating defects in an electric circuit as recited in claim 5, whereby said spatial displacement selecting step further including the steps of:

adding a spatial translation value to said spatial displacement value; and, adding a spatial rotation value to said spatial displacement value.

7. The method for locating defects in an electric circuit as recited in claim 1, further including the step of providing said scanning magnetic microscope with a cryogenic magnetic field detector.

8. The method for locating defects in an electric circuit as recited in claim 6, further including the step of providing said cryogenic magnetic field detector with a superconducting quantum interference device sensor.

9. The method for locating defects in an electric circuit as recited in claim 1, whereby said registration error measure computing step includes the step of calculating a maximum matrix norm of said difference between said transformed micrographic image and said reference micrographic image.

10. The method for locating defects in an electric circuit as recited in claim 1, whereby said registration error measure computing step includes the step of calculating a standard deviation of said difference between said transformed micrographic image and said reference micrographic image.

11. The method for locating defects in an electric circuit as recited in claim 1, whereby said registration error measure computing step includes the step of calculating an image entropy measure of said difference between said transformed micrographic image and said reference micrographic image.

12. A method for locating defects in a microelectronic circuit, the method comprising the steps of:

providing a scanning magnetic microscope for obtaining micrographic images of magnetic fields, said scanning magnetic microscope including a magnetic probe selectively displaceable relative to a specimen securing stage;

providing a distance determining probe to said scanning magnetic microscope for respectively determining a corresponding distance from said reference circuit to said magnetic probe and from said circuit-under-test to said magnetic probe;

obtaining from a first region of a reference circuit secured to said specimen securing stage a reference micrographic image of a first magnetic field emitted therefrom responsive to a first test current, said first region spatially located on said reference circuit relative to a first fiducial thereon, said first micrographic image including a predetermined number of pixels;

obtaining from a second region of a circuit-under-test secured to said specimen securing stage a test micrographic image of a second magnetic field emitted therefrom responsive to a second test current, said circuit-under-test circuit being substantially identical in construction to said reference circuit, said second region spatially located on said circuit-under-test relative to a second fiducial thereon, said second fiducial located at a relative location of said circuit-under-test equivalent to the relative location of the first fiducial to said reference circuit, said second test current being substantially equivalent in direction and magnitude to said first test current, said second micrographic image including said predetermined number of pixels;

adjusting said distance from said reference circuit to said magnetic probe during said reference micrographic image obtaining step to be equivalent to said distance from said circuit-under-test to said magnetic probe during said test micrographic image obtaining step;

selecting a spatial displacement value to apply to said test micrographic image; and, applying a spatial transform to said test micrographic image for producing a transformed micrographic image of a spatially displaced magnetic field thereof, said spatial transform computing pixel values for said transformed micrographic image via an interpolation function determined from said predetermined number of pixels of said test micrographic image, said interpolation function computing an estimated magnetic field value for a spatial coordinate of said second magnetic field offset by said spatial displacement value;

computing a registration error measure as a difference between said transformed micrographic image and said reference micrographic image; and repeating the method at said spatial displacement value selecting step until said registration error measure is minimized.

13. The method for locating defects in an electric circuit as recited in claim 12 further including the steps of:

providing said specimen securing stage with a three-axis translation stage for selectively displacing said specimen securing stage along three orthogonal axes relative to said magnetic probe;

providing said three-axis translation stage with a translation stage controller for controlling the displacement thereof;

providing said distance determining probe with a touch probe, said touch probe providing an electric signal to said translation stage controller when contact by said touch probe with a surface is established.

14. The method for locating defects in an electric circuit as recited in claim 13, whereby said distance adjusting step includes the steps of:

determining at a plurality of locations on said reference circuit a distance at which said electric signal is provided by said touch probe;

determining at a plurality of locations on said circuit-under-test a distance at which said electric signal is provided by said touch probe; and controlling said three-axis translation stage with said translation stage controller such that said distance at which said electric signal is provided by said touch probe is maintained during said reference micrographic image obtaining step and during said test micrographic image obtaining step.

15. The method for locating defects in an electric circuit as recited in claim 12, whereby said spatial transform applying step includes the steps of:

determining a set of polynomial coefficients by applying a spline fit algorithm to said predetermined number of pixels of said test micrographic image; and forming a polynomial in spatial coordinates of said second magnetic field from said polynomial coefficients, said polynomial providing said interpolation function; and, computing said estimated magnetic field value for each of said predetermined number of pixels of said test micrographic image by supplying spatial coordinates of each of said predetermined number of pixels of said test micrographic image offset by said spatial displacement value to said interpolation function.

16. The method for locating defects in an electric circuit as recited in claim 15, whereby said spatial displacement selecting step further including the steps of:

adding a spatial translation value to said spatial displacement value; and, adding a spatial rotation value to said spatial displacement value.

17. The method for locating defects in an electric circuit as recited in claim 12, further including the step of providing said scanning magnetic microscope with a cryogenic magnetic field detector.

18. The method for locating defects in an electric circuit as recited in claim 17, further including the step of providing said cryogenic magnetic field detector with a superconducting quantum interference device sensor.

19. The method for locating defects in an electric circuit as recited in claim 12, whereby said registration error measure computing step includes the step of calculating a standard deviation of said difference between said transformed micrographic image and said reference micrographic image.

20. The method for locating defects in an electric circuit as recited in claim 12, whereby said registration error measure computing step includes the step of calculating an image entropy measure of said difference between said transformed micrographic image and said reference micrographic image.

* * * * *